(12) United States Patent
Balakrishnan et al.

(10) Patent No.: US 10,714,593 B2
(45) Date of Patent: *Jul. 14, 2020

(54) FABRICATION OF STRAINED VERTICAL P-TYPE FIELD EFFECT TRANSISTORS BY BOTTOM CONDENSATION

(71) Applicant: INTERNATIONAL BUSINESS MACHINES CORPORATION, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 159 days.

This patent is subject to a terminal disclaimer.

(21) Appl. No.: 16/040,149

(22) Filed: Jul. 19, 2018

(65) Prior Publication Data

US 2018/0350953 A1   Dec. 6, 2018

Related U.S. Application Data

(63) Continuation of application No. 15/450,715, filed on Mar. 6, 2017, now Pat. No. 10,084,064, which is a
(Continued)

(51) Int. Cl.
*H01L 21/22* (2006.01)
*H01L 29/66* (2006.01)
(Continued)

(52) U.S. Cl.
CPC .. *H01L 29/66666* (2013.01); *H01L 21/02164* (2013.01); *H01L 21/02236* (2013.01);
(Continued)

(58) Field of Classification Search
None
See application file for complete search history.

(56) References Cited

U.S. PATENT DOCUMENTS 9,647,112 B1 * 5/2017 Balakrishnan ...... H01L 29/7845
10,084,064 B2 * 9/2018 Balakrishnan ...... H01L 29/7845

OTHER PUBLICATIONS

U.S. Appl. No. 15/273,252, filed Sep. 22, 2016, now U.S. Pat. No. 9,647,112.
(Continued)

*Primary Examiner* — Michael Lebentritt
(74) *Attorney, Agent, or Firm* — Tutunjian & Bitetto, P.C.; L. Jeffrey Kelly

(57) ABSTRACT

A method of forming a strained vertical p-type field effect transistor, including forming a counter-doped layer at a surface of a substrate, forming a source/drain layer on the counter-doped layer, forming one or more vertical fins on the source/drain layer, removing a portion of the source/drain layer to form one or more bottom source/drains below each of the one or more vertical fins, reacting an exposed portion of each of the one or more bottom source/drains with a reactant to form a disposable layer on opposite sides of each bottom source/drain and a condensation layer between the two adjacent disposable layers, and removing the disposable layers.

20 Claims, 11 Drawing Sheets

Related U.S. Application Data continuation of application No. 15/273,252, filed on Sep. 22, 2016, now Pat. No. 9,647,112.

(51) Int. Cl.
| | |
|---|---|
| H01L 29/78 | (2006.01) |
| H01L 29/06 | (2006.01) |
| H01L 21/768 | (2006.01) |
| H01L 29/786 | (2006.01) |
| H01L 29/08 | (2006.01) |
| H01L 21/02 | (2006.01) |
| H01L 21/225 | (2006.01) |
| H01L 21/311 | (2006.01) |
| H01L 21/761 | (2006.01) |

(52) U.S. Cl.
CPC .... *H01L 21/2251* (2013.01); *H01L 21/31105* (2013.01); *H01L 21/761* (2013.01); *H01L 21/76895* (2013.01); *H01L 29/0649* (2013.01); *H01L 29/0847* (2013.01); *H01L 29/66553* (2013.01); *H01L 29/7827* (2013.01); *H01L 29/7845* (2013.01); *H01L 29/7848* (2013.01); *H01L 29/78642* (2013.01); *H01L 21/31111* (2013.01); *H01L 21/31116* (2013.01)

(56) References Cited

OTHER PUBLICATIONS

U.S. Appl. No. 15/450,715, filed Mar. 6, 2017, 2018-0083122.
List of IBM Patents or Patent Applications Treated as Related dated Jul. 19, 2018, 2 pages.

* cited by examiner

FABRICATION OF STRAINED VERTICAL P-TYPE FIELD EFFECT TRANSISTORS BY BOTTOM CONDENSATION

BACKGROUND

Technical Field

The present invention generally relates to producing strained channels during the fabrication of vertical fin field effect transistors (vertical FinFETs), and more particularly to forming vertical fins having a compressive stress through a condensation of an underlying silicon-germanium source/drain (S/D) region.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and finFETs have been formed with the channel extending outward from the substrate, but where the current also flows horizontally from a source to a drain. The channel for the finFET can be an upright slab of thin rectangular Si, commonly referred to as the fin with a gate on the fin, as compared to a MOSFET with a single gate in the plane of the substrate. Depending on the doping of the source and drain, an n-FET or a p-FET can be formed.

Examples of FETs can include a metal-oxide-semiconductor field effect transistor (MOSFET) and an insulated-gate field-effect transistor (IGFET). Two FETs also can be coupled to form a complementary metal oxide semiconductor (CMOS), where a p-channel MOSFET and n-channel MOSFET are coupled together.

With ever decreasing device dimensions, forming the individual components and electrical contacts become more difficult. An approach is therefore needed that retains the positive aspects of traditional FET structures, while overcoming the scaling issues created by forming smaller device components.

SUMMARY

In accordance with an embodiment of the present invention, a method of forming a strained vertical p-type field effect transistor is provided. The method includes forming a counter-doped layer at a surface of a substrate. The method further includes forming a source/drain layer on the counter-doped layer. The method further includes forming one or more vertical fins on the source/drain layer. The method further includes removing a portion of the source/drain layer to form one or more bottom source/drain regions below each of the one or more vertical fins. The method further includes reacting an exposed portion of each of the one or more bottom source/drain regions with a reactant to form a disposable layer on opposite sides of each bottom source/drain region and a condensation source/drain pillar between the two adjacent disposable layers. The method further includes removing the disposable layers.

In accordance with another embodiment of the present invention, a method of forming a strained vertical p-type field effect transistor is provided. The method includes forming a counter-doped layer at a surface of a substrate. The method further includes forming a source/drain layer on the counter-doped layer, wherein the source drain layer is silicon-germanium. The method further includes forming one or more vertical fins on the source/drain layer. The method further includes removing a portion of the source/drain layer to form one or more bottom source/drain regions below each of the one or more vertical fins. The method further includes oxidizing an exposed portion of each of the one or more bottom source/drain regions with a reactant to form a disposable layer on opposite sides of each condensation source/drain pillar between the two adjacent disposable layers, and removing the disposable layers.

In accordance with yet another embodiment of the present invention, a strained vertical p-type field effect transistor is provided. The strained vertical p-type field effect transistor includes a counter-doped layer at a surface of a substrate. The strained vertical p-type field effect transistor further includes one or more condensation source/drain pillar(s) on the counter-doped layer. The strained vertical p-type field effect transistor further includes a vertical fin on each of the one or more condensation source/drain pillar(s). The strained vertical p-type field effect transistor further includes an interlayer dielectric spacer covering at least a portion of the one or more condensation source/drain pillar(s).

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
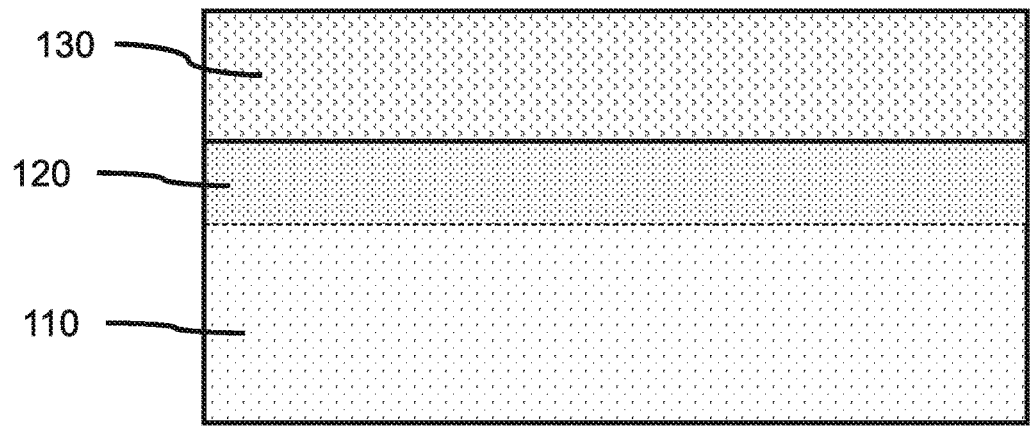
FIG. 1 is a cross-sectional side view showing a source/drain layer on a counter-doped layer at the surface of a substrate, in accordance with an embodiment of the present invention.

Principles and embodiments of the present invention relate to fabricating vertical fin field effect transistors (vertical FinFETs) having the vertical fins under a compressive stress, where the compressive stress is induced by an underlying condensation layer. The condensation layer can be formed from a bottom source/drain region by an oxidation reaction.

Principles and embodiments of the present invention relate generally to imparting a strain to the channel of a vertical FinFET device by altering the crystal structure of a source/drain region underlying the vertical fin forming the device channel. Channel strain can be an important performance enhancement element for present nodes and is useful for vertical transistor structures, in particular for SiGe pFETs.

Principles and embodiments of the present invention relate to forming a vertical fin on a crystalline, compound semiconductor source/drain layer, and reacting at least a portion of the source/drain layer to condense the compound semiconductor source/drain layer in the region below the vertical fin to enrich one component of the compound. The condensation reaction can modify the source/drain region lattice constant, for example, by increasing the germanium concentration in an intended portion of the source/drain region. An oxidation reaction can be used to selectively consume one component of a compound semiconductor used to form the source/drain region, for example, a silicon-germanium source/drain region can be oxidized to increase the germanium concentration in a remaining portion of the source/drain region.

Principles and embodiments of the present invention relate to inducing a compressive strain to a vertical fin forming the channel of a vertical FinFET device (i.e., where the current flows effectively perpendicularly to the plane of the substrate). The compressive strain may be introduced by expanding the lattice structure of a material beneath the vertical fin to compresses the fin, while the fin remains anchored in position. A strained vertical pFET structure can be formed by a bottom condensation.

Exemplary applications/uses to which the present invention can be applied include, but are not limited to: transistors for complementary metal-oxide-semiconductor (CMOS) devices, logic devices (e.g., NAND gates, NOR gates, etc.), memory devices (e.g., DRAM, SRAM, flip-flops, etc.).

In various embodiments, the materials and layers can be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PEALD). The depositions can be epitaxial processes, and the deposited material can be crystalline. In various embodiments, formation of a layer may be by one or more deposition processes, where, for example, a conformal layer can be formed by a first process (e.g., ALD, PEALD, etc.) and a fill can be formed by a second process (e.g., CVD, electrodeposition, PVD, etc.).

It is to be understood that the present invention will be described in terms of a given illustrative architecture; however, other architectures, structures, substrate materials and process features and steps may be varied within the scope of the present invention.

It should be noted that certain features may not be shown in all figures for the sake of clarity. This is not intended to be interpreted as a limitation of any particular embodiment, or illustration, or scope of the claims.

Reference to source/drain projections, layers, regions, etc., is intended to indicate that the particular device feature can be implemented as a source or a drain except as expressly indicated otherwise. In addition, the role of source and drain for an active device can in some instances be reversed, so a previously indicated drain may instead be a source and vice versa. Reference to a source/drain is, therefore, intended to encompass the broadest reasonable scope of the term.

Referring now to the drawings in which like numerals represent the same or similar elements and initially to FIG. 1, a cross-sectional side view of a source/drain layer on a counter-doped layer at the surface of a substrate is shown, in accordance with an embodiment of the present invention.

In one or more embodiments, a substrate 110 can be a semiconductor or an insulator with a semiconductor active surface layer (ASL). The substrate can be crystalline, semi-crystalline, microcrystalline, or amorphous. The substrate can be essentially (i.e., except for contaminants) a single element (e.g., silicon), primarily (i.e., with doping) of a single element, for example, silicon (Si) or germanium (Ge), or the substrate can include a compound, for example, $Al_2O_3$, $SiO_2$, GaAs, SiC, or SiGe. In various embodiments, the substrate can be a compound semiconductor material, for example, silicon-germanium (SiGe), silicon carbide (SiC), gallium nitride (GaN), gallium arsenide (GaAs), indium gallium arsenide (InGaAs), indium phosphide (InP), zinc antimonide (ZnSb), etc.

In one or more embodiments, the substrate can have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI), where an active surface layer (ASL) of the substrate 110 can be on a substrate insulator layer (e.g., buried oxide layer (BOX)). The substrate 110 can also have other layers forming the substrate, including high-k oxides and/or nitrides.

In various embodiments, the substrate may be a single crystal silicon (Si) or silicon germanium (SiGe) wafer, or have a single crystal silicon (Si) or silicon germanium (SiGe) active surface layer.

In one or more embodiments, the substrate 110 or at least an active surface layer of the substrate can be suitably doped to form a p-type or n-type semiconductor.

In one or more embodiments, a counter-doped layer 120 can be formed by providing a dopant of an opposite type from the substrate dopant in a layer at the surface of the substrate 110 or ASL. In various embodiments, the counter-doped layer 120 can be formed by introducing a counter dopant into at least a portion of the surface of the substrate 110 or ASL, or by forming an in-situ, counter-doped layer on at least a portion of the surface of the substrate 110 or ASL (e.g., by epitaxial growth).

In one or more embodiments, the counter dopant can be introduced into the surface of the substrate 110 or ASL to a predetermined depth by, for example, ion bombardment, or gaseous diffusion. In various embodiments, the counter-doped region 120 may be formed in-situ, for example, during epitaxial growth of an active semiconductor layer on a crystalline surface of the substrate 110. Other suitable doping techniques may also be used, including but not limited to, gas phase doping, plasma doping, plasma immersion ion implantation, cluster doping, infusion doping, liquid phase doping, solid phase doping, or combinations thereof. In various embodiments, the counter-doped region 120 can be n-doped or p-doped, where the dopant type may be the opposite polarity of the substrate and/or an intended source/drain region for a device (e.g., nFET, pFET).

The dopant concentration of the counter-doped layer 120 can be in the range of about $1 \times 10^{17}$ cm$^{-3}$ to about $2 \times 10^{21}$ cm$^{-3}$, or about $1 \times 10^{19}$ cm$^{-3}$ to about $2 \times 10^{21}$ cm$^{-3}$, although lower or higher dopant concentrations are also contemplated. In various embodiments, the dopants species may have a concentration in the range of about $1 \times 10^{17}$/cm$^3$ to about $1 \times 10^{19}$/cm$^3$, or about $1 \times 10^{18}$/cm$^3$ to about $1 \times 10^{20}$/cm$^3$, or about $1 \times 10^{18}$/cm$^3$ to about $1 \times 10^{19}$/cm$^3$. In various embodiments, the n-type dopants may include phosphorus (P), arsenic (As) and antimony (Sb), and p-type dopants include boron (B), gallium (Ga), and indium (In).

In one or more embodiments, the surface of the substrate and/or counter-doped layer 120 can be prepared, for example, by cleaning, etching, chemical-mechanical polishing, etc., to have a clean, flat surface for subsequent processes, including but not limited to, epitaxial growth, non-epitaxial depositions, thermal oxidation or nitridation, ion implantation, dopant diffusion, etc.

In one or more embodiments, a source/drain layer 130 can be formed on the counter-doped layer 120, where the source/drain layer 130 can be formed by epitaxial growth and/or a deposition process, for example, molecular beam epitaxy (MBE), chemical vapor deposition epitaxy, atomic layer depsoition (ALD), plasma-enhanced chemical vapor deposition (PECVD), physical vapor deposition (PVD) etc.

In various embodiments, the source/drain layer 130 can be heavily doped, where the source/drain layer 130 has a dopant concentration in the range of about $1 \times 10^{19}$ cm$^{-3}$ to about $5 \times 10^{21}$ cm$^{-3}$, or about $1 \times 10^{20}$ cm$^{-3}$ to about $5 \times 10^{21}$ cm$^{-3}$, or about $1 \times 10^{20}$ cm$^{-3}$ to about $1 \times 10^{21}$ cm$^{-3}$. The source/drain layer 130 can be n-doped or p-doped. In various embodiments, the n-type dopants may include phosphorus (P), arsenic (As) and antimony (Sb), and p-type dopants include boron (B), gallium (Ga), and indium (In).

In an non-limiting exemplary embodiments, the source/drain layer 130 can be a heavily doped silicon-germanium layer epitaxially grown on a crystal plane (e.g., (100), (110), (111), etc.) of the crystalline material surface (e.g., single crystal silicon or silicon germanium) to have a predetermined crystal orientation.

In one or more embodiments, the source/drain layer 130 can have a thickness in the range of about 5 nm to about 500 nm, or in the ranger of about 10 nm to about 200, or 20 nm to 100 nm.

Figure 2:
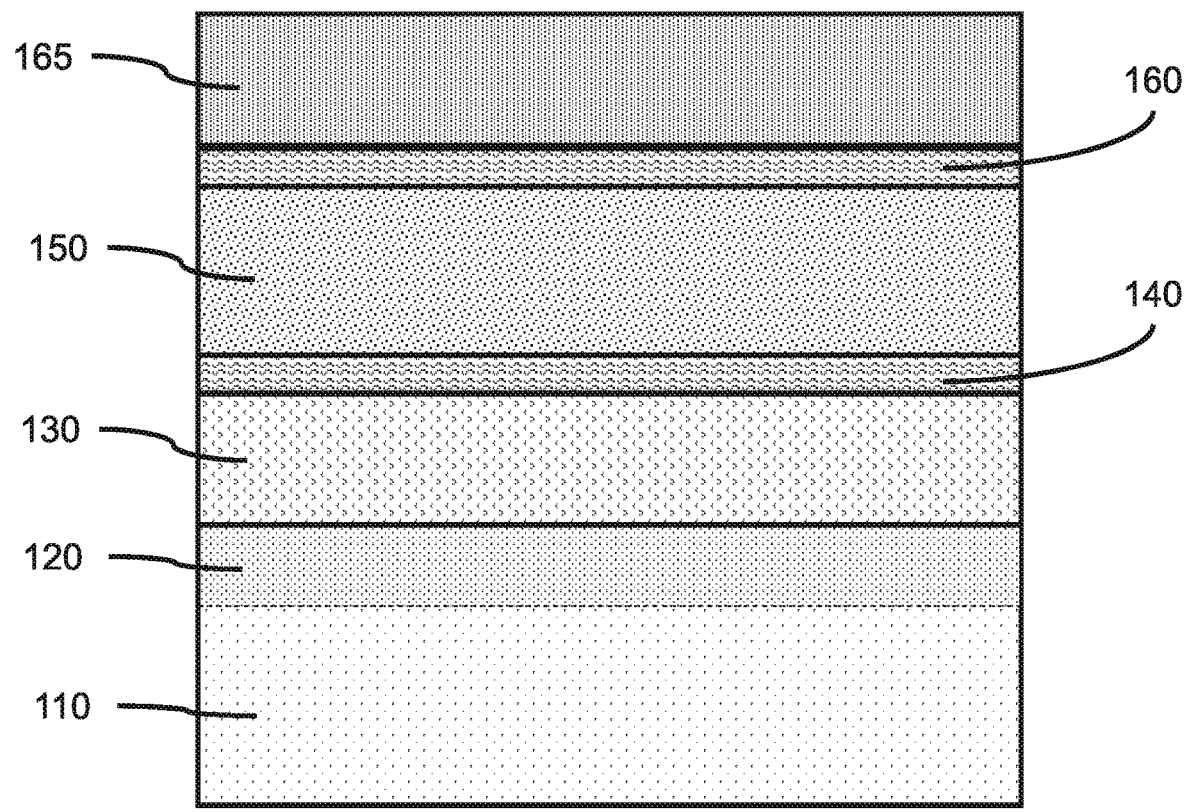
FIG. 2 is a cross-sectional side view showing a bottom spacer layer on the source/drain layer, a dummy gate layer on the bottom spacer layer, a top spacer layer on the dummy gate layer, and a cover layer on the top spacer layer, in accordance with an embodiment of the present invention.

FIG. 2 is a cross-sectional side view showing a bottom spacer layer on the source/drain layer, a dummy gate layer on the bottom spacer layer, a top spacer layer on the dummy gate layer, and a cover layer on the top spacer layer, in accordance with an embodiment of the present invention.

In one or more embodiments, a bottom spacer layer 140 can be formed on at least a portion of the source/drain layer 130, where the bottom spacer layer 140 can be an insulating dielectric that physically separates and electrically insulates the source/drain layer 130 from a dummy gate layer 150. The bottom spacer layer 140 can be formed by a deposition process (e.g., CVD, PECVD, PVD, etc.) on the source/drain layer 130.

In one or more embodiments, a bottom spacer layer 140 can be silicon oxide (SiO), silicon nitride (SiN), silicon oxynitride (SiON), silicon oxycarbide (SiOC), silicon carbonitride (SiCN), silicon oxy-carbonitride (SiOCN), silicon boronitride (SiBN), silicon borocarbide (SiBC), silicon boro carbonitride (SiBCN), boron carbide (BC), boron nitride (BN), or a suitable combination thereof.

In one or more embodiments, the bottom spacer layer 140 can have a thickness in the range of about 3 nm to about 25 nm, or in the range of about 5 nm to about 20 nm. The bottom spacer layer 140 can provide physical separation and electrical isolation of subsequently formed gate electrode from the source/drain layer 130. The bottom source/drain layer may act as an etch stop during removal of a dummy gate layer. In various embodiments, the bottom spacer layer 140 may be optional.

In one or more embodiments, a dummy gate layer 150 can be formed on the bottom spacer layer 140, where the dummy gate layer may be formed on the bottom spacer layer by CVD, PECVD, PVD, etc. If the bottom spacer layer is omitted, the dummy gate layer 150 can be formed directly on the source/drain layer.

In one or more embodiments, a dummy gate layer 150 can have a thickness in the range of about 10 nm to about 200 nm, or in the range of about 15 nm to about 150 nm, or in the range of about 20 nm to about 40 nm, where the thickness of the dummy gate layer 150 can determined the gate length of a subsequently formed gate structure. The thickness of the dummy gate layer 150, the bottom spacer layer 140, and the top spacer layer 160, also can determine the channel length of a vertical FinFET device and the height of the vertical fin, where a vertical fin extends from the source/drain layer to a height above a top spacer.

In one or more embodiments, the dummy gate layer 150 can be a material that can be easily and selectively removed from between the bottom spacer layer 140 or source/drain layer, and the top spacer layer 160, including, but not limited to, poly-silicon (p-Si), amorphous silicon (a-Si), poly-germanium (p-Ge), amorphous germanium (a-Ge), poly silicon-germanium (p-SiGe), amorphous silicon-germanium (a-SiGe), amorphous carbon (a-C), silicon oxide (SiO), silicon nitride (SiN), silicon oxynitride (SiON), and combinations thereof. In various embodiments, the dummy gate layer 150 may include multiple material layers (e.g., a capping layer), where the dummy gate layer 150 can be a dummy gate layer stack.

In one or more embodiments, a top spacer layer 160 can be formed on the dummy gate layer 150 to electrically isolate a gate structure from a top source/drain. The top spacer layer may be formed on the dummy gate layer, for example, by CVD, PECVD, PVD, etc.

In one or more embodiments, the top spacer layer 160 can have a thickness in the range of about 1 nm to about 20 nm, or in the range of about 4 nm to about 10 nm.

In various embodiments, the top spacer layer 160 can be silicon oxide (SiO), silicon nitride (SiN), silicon oxynitride (SiON), silicon oxycarbide (SiOC), silicon carbonitride (SiCN), silicon oxy-carbonitride (SiOCN), silicon boronitride (SiBN), silicon borocarbide (SiBC), silicon boro carbonitride (SiBCN), boron carbide (BC), boron nitride (BN), or combinations thereof, where the dummy gate layer 150 can be selectively etched relative to the top spacer layer 160.

In various embodiments, the top spacer layer 160 can be the same material as the bottom spacer layer 140. In other embodiments, the top spacer layer 160 can be a different material from the bottom spacer layer 140. The top spacer layer and bottom spacer layer can be a different material from the dummy gate layer 150, so the dummy gate layer can be selectively removed. In various embodiments, the top spacer layer 160 and bottom spacer layer 140 can act as hardmasks for etching the dummy gate layer, and/or as an etch-stop.

In one or more embodiments, a cover layer 165 can be formed on at least a portion of the top spacer layer 160, where the cover layer may be a hardmask. In various embodiments, the cover layer 165 can be silicon oxide (SiO), silicon nitride (SiN), silicon oxynitride (SiON), or combinations thereof, where the cover layer is a different material from the top spacer layer, so the cover layer can be selectively removed.

In one or more embodiments, the cover layer 165 can provide a mask for forming the vertical fins, and defining a height of the vertical fins.

Figure 3:
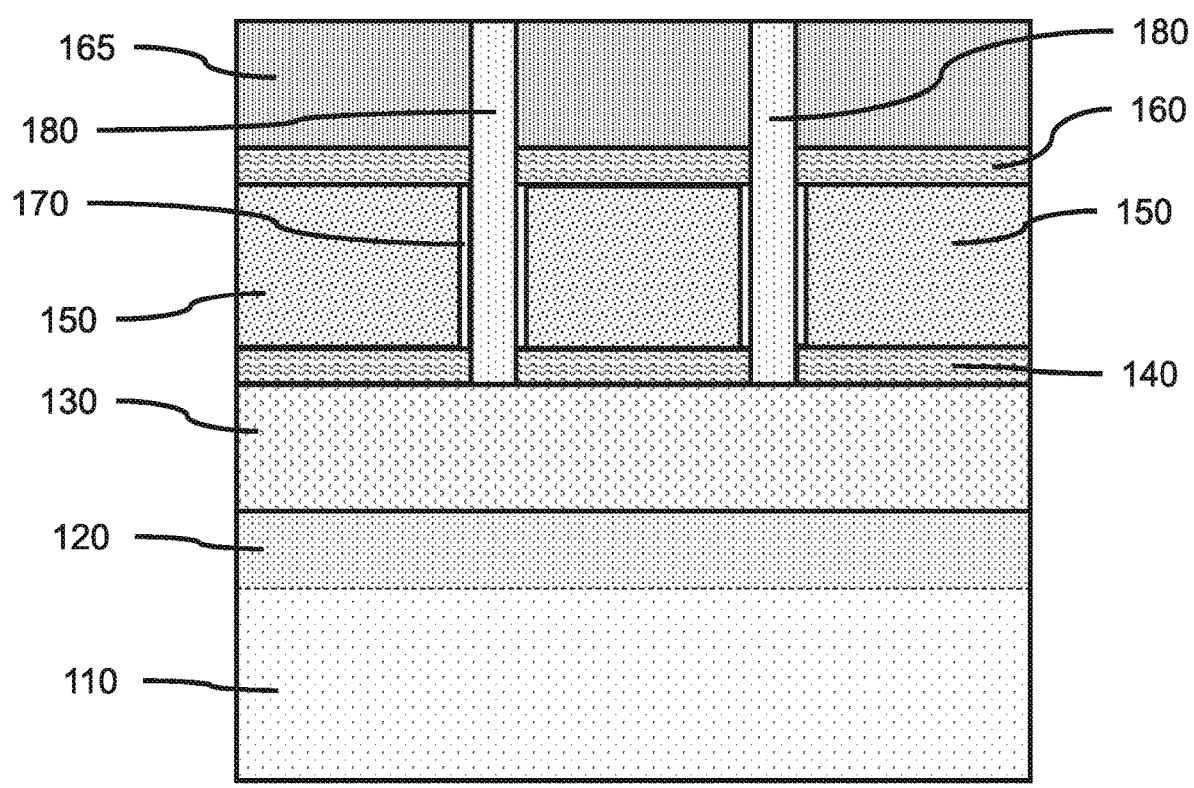
FIG. 3 is a cross-sectional side view showing two vertical fins formed on the source/drain layer through the cover layer, top spacer layer, dummy gate layer, and bottom spacer layer, in accordance with an embodiment of the present invention.

FIG. 3 is a cross-sectional side view showing two vertical fins formed on the source/drain layer through the cover layer, top spacer layer, dummy gate layer, and bottom spacer layer, in accordance with an embodiment of the present invention.

In one or more embodiments, one or more openings can be formed in the cover layer 165 and top spacer layer 160 by masking the cover layer 165 with a resist material layer (e.g., organic photo-resist material, e-beam resist material, etc.). The resist material layer can be patterned and developed to expose portions of the underlying cover layer 165, as would be known in the art. The exposed portions of the cover layer 165 and top spacer layer 160 can be removed to form an initial opening of a predetermined size to expose the underlying dummy gate layer 150, where a directional etch (e.g., RIE) can be used to remove the exposed portions of the cover layer 165 and top spacer layer 160 to expose the dummy gate layer 150.

The exposed portions of the dummy gate layer 150 can be removed using a directional etch (e.g., RIE) to form one or more fin cavities in the dummy gate layer 150. The fin cavities can be formed down to the bottom spacer layer 140, which can act as an etch-stop.

In one or more embodiments, a dummy gate dielectric 170 can be formed in the fin cavity, where the dummy gate dielectric can be formed on the vertical sidewalls of the of the dummy gate layer 150 exposed by formation of the fin cavity. In various embodiments, the dummy gate dielectric 170 can be an oxide or a nitride layer formed by reacting the material of the dummy gate layer 150 with a suitable reactant or reactants. The dummy gate dielectric 170 (e.g., SiON, SiB, SiO, SiGeON, etc.) may also be formed by a plasma or thermal reaction, on the vertical sidewalls of the of the dummy gate layer 150 exposed by formation of the fin cavity. In various embodiments, the dummy gate dielectric 170 can be an amorphous material that can avoid nucleation and epitaxial growth on the sides of the fin cavity.

In one or more embodiments, after formation of the dummy gate dielectric 170, a selective directional etch (e.g., RIE) can be used to extend the fin cavities to the source/drain layer 130. In various embodiments, extending the fin cavity to the source/drain layer 130 exposes the crystalline surface of the source/drain layer 130.

In one or more embodiments, a vertical fin 180 can be formed in the fin cavity, where the vertical fin can be formed by epitaxial growth on the exposed surface of the source/drain layer 130 at the bottom of the fin cavity. The vertical fin(s) 180 can be a single crystal material that fills the fin cavity. The vertical fin(s) may not nucleate on the fin cavity sidewalls because the dummy gate dielectric 170 provides a surface that resists epitaxial growth. In various embodiments, the one or more vertical fins 180 can extend above the top surface of top spacer layer 160 and/or the resist material layer, and a CMP can be used to reduce the height of the vertical fins to the surface of the cover layer 165.

In one or more embodiments, the one or more vertical fin(s) 180 can have a height in the range of about 40 nm to about 250 nm, or in the range of about 60 nm to about 250 nm, or in the range of about 100 nm to about 200 nm, although other heights are also contemplated. One or more vertical fin(s) 180 can form a channel of a vertical FinFET device.

In one or more embodiments, the vertical fin(s) 180 can be silicon, germanium, or silicon-germanium, where the vertical fin(s) can be single crystal material. In various embodiments, the vertical fin(s) 180 can be suitably doped to provide a channel with predetermined carriers and carrier density. In various embodiments, the vertical fin(s) can be undoped, intrinsic semiconductor material, or the vertical fin(s) can be doped in situ during formation, where the dopant concentration can be in the range of about $1 \times 10^{16}$ to $5 \times 10^{18}$ cm$^{-3}$.

Figure 4:
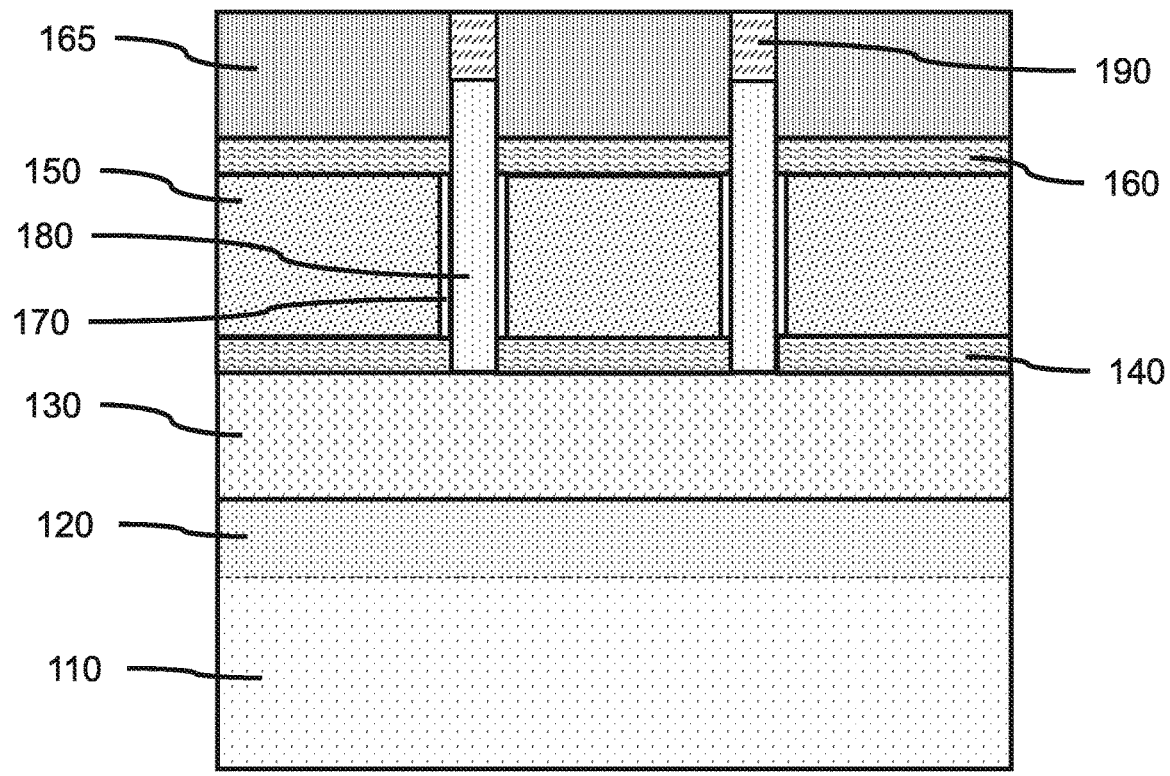
FIG. 4 is a cross-sectional side view showing a fin cap formed on each of the plurality of vertical fins, in accordance with an embodiment of the present invention

FIG. 4 is a cross-sectional side view showing a fin cap formed on each of the plurality of vertical fins, in accordance with an embodiment of the present invention.

In one or more embodiments, a portion of an upper section of the vertical fin(s) 180 above the top surface of the top spacer layer 160 can be at least partially removed to form a cover layer opening above the top of the vertical fin 180. The portion of the vertical fin can be removed by a selective isotropic or directional etch (e.g., RIE), where the resulting vertical fin(s) 180 have a reduced height.

In one or more embodiments, a fin cap 190 can be formed in the cover layer openings, where the fin cap(s) 190 can be blanket deposited as a layer, and a portion of the fin cap layer above the surface of the cover layer can be removed by CMP. In various embodiments, the fin cap(s) can be silicon nitride (SiN) or silicon oxynitride (SiON). The fin caps can act as a hardmask to protect the tops of the vertical fin(s) 180 during subsequent etching processes.

Figure 5:
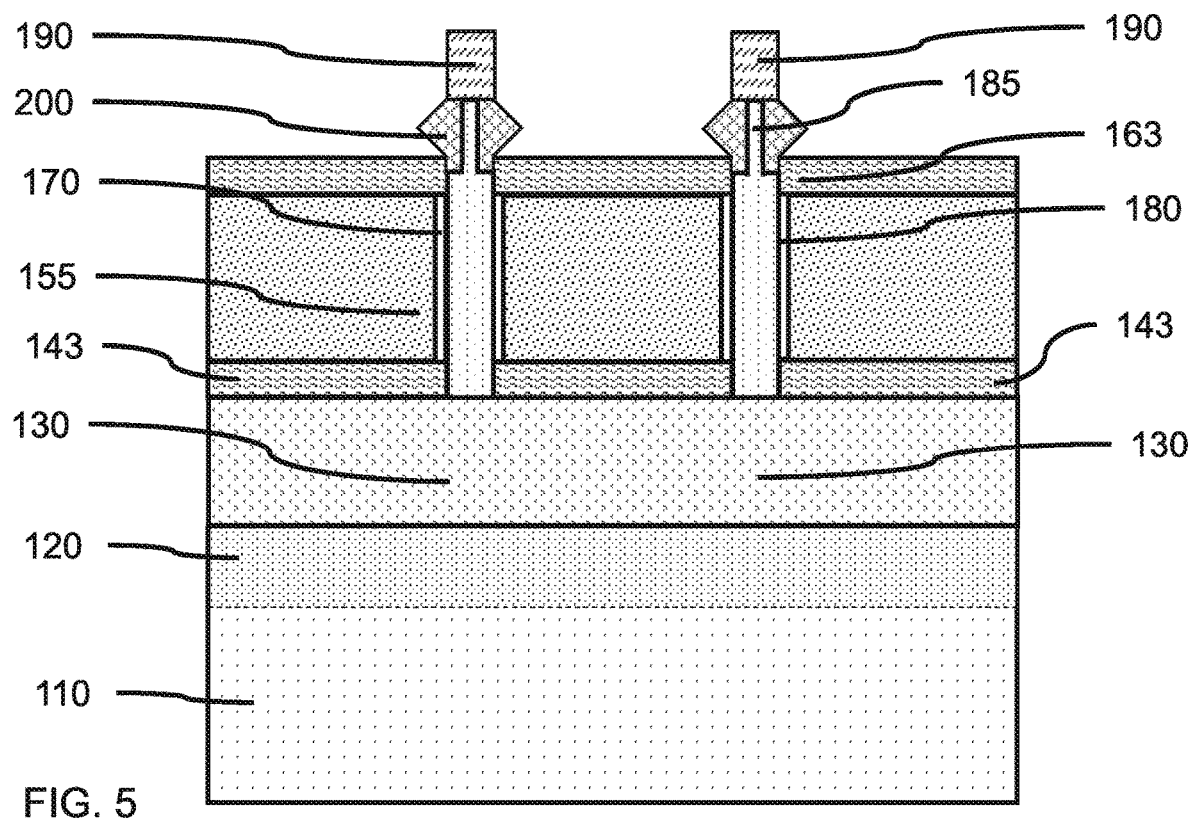
FIG. 5 is a cross-sectional side view showing top source/drains formed on each of the plurality of vertical fins after removal of the cover layer, in accordance with an embodiment of the present invention.

FIG. 5 is a cross-sectional side view showing top source/drains formed on each of the plurality of vertical fins after removal of the cover layer, in accordance with an embodiment of the present invention.

In one or more embodiments, the cover layer 165 can be removed after formation of the fin caps to expose at least a portion of the sidewalls of an upper section of the vertical fin(s) 180. An isotropic etch can be used to remove the cover layer 165.

In one or more embodiments, a portion of an upper section of the vertical fin(s) 180 above the top surface of the top spacer layer 160 can be at least partially removed to form a fin post 185, where the fin post can provide crystalline surfaces for formation of a top source/drain 200. In various embodiments, the top source/drains 200 can be epitaxially grown on the exposed surfaces of the fin post 185 and exposed top surface of the vertical fin 180. The fin cap 190 can remain on the fin post 185 after etching the portion of the vertical fin 180, where the fin cap 190 can prevent formation of a top source/drain 200 on the top surface of the fin post 185.

In one or more embodiments, the top source/drains 200 can be doped in situ (i.e., during formation of the source/drains), or ex situ (i.e., after formation), for example by gas phase doping, plasma doping, plasma immersion ion implantation, cluster doping, infusion doping, liquid phase doping, solid phase doping, or combinations thereof.

Figure 6:
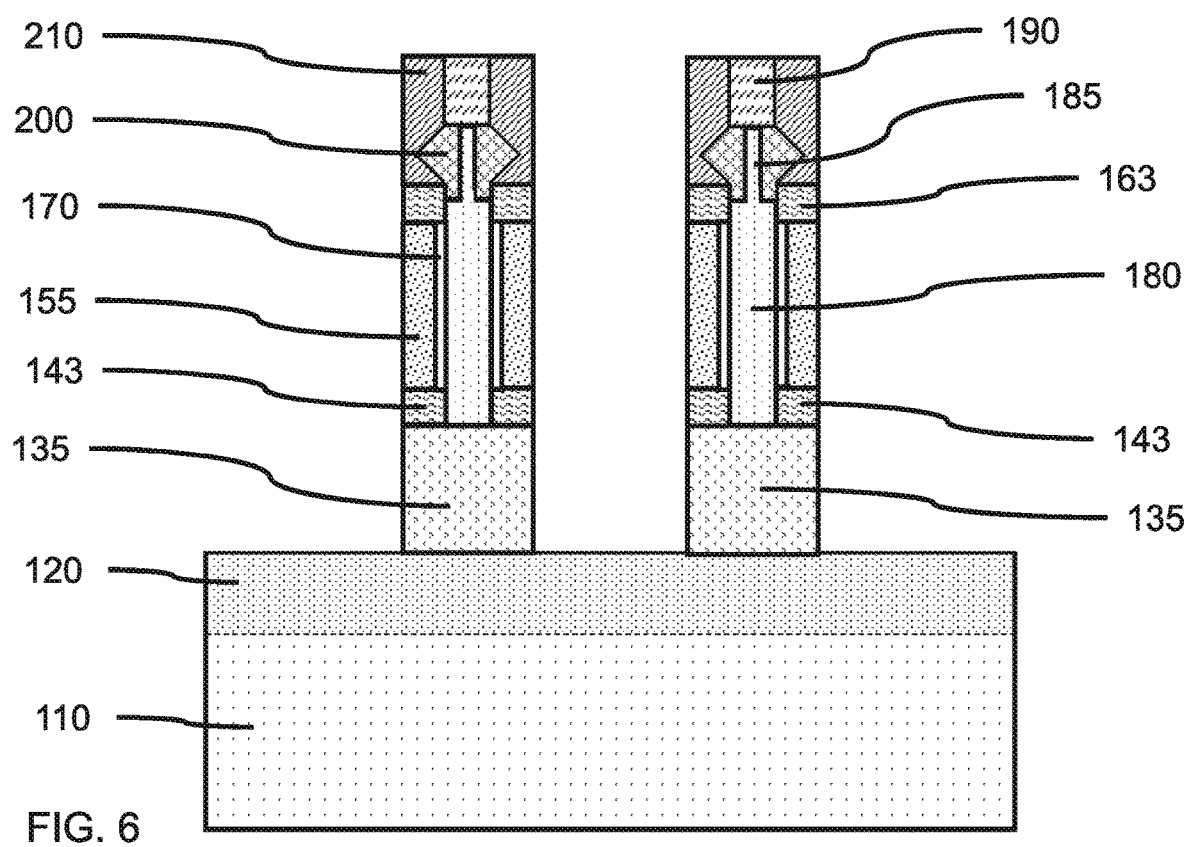
FIG. 6 is a cross-sectional side view showing a plurality of bottom source/drain regions on the counter-doped layer, and a vertical fin and dummy gate on each of the bottom source/drain regions, in accordance with an embodiment of the present invention.

FIG. 6 is a cross-sectional side view showing a plurality of bottom source/drain regions on the counter-doped layer, and a vertical fin and dummy gate on each of the bottom source/drain regions, in accordance with an embodiment of the present invention.

In one or more embodiments, a protective cap 210 can be formed on the top source/drains 200, fin cap 190, and top spacer layer 160, where the protective cap can be blanket deposited on the top spacers 160, top source/drains 200, and fin cap 190, and patterned and removed, as would be known in the art. The layer forming the protective cap 210 can be patterned and removed to leave the protective cap 210 and expose intervening portions of the top spacer layer 160. In various embodiments, the protective cap 210 can be a hardmask that covers the top source/drains 200 and portions of the top spacer layer 160 during subsequent processing steps.

In one or more embodiments, the protective cap 210 can be silicon oxide (SiO), silicon nitride (SiN) or silicon oxynitride (SiON), where the protective cap(s) can be a different material than the top spacers 163 and fin caps, so the protective caps 210 can be selectively removed.

In one or more embodiments, the exposed portions of the top spacer layer 160 between the protective caps 210 can be removed to form top spacers 163 on dummy gates 155 and dummy gate dielectric 170 below a portion of the protective cap. The exposed portions of the top spacer layer 160 can be removed by a directional etch (e.g., RIE). The directional etch may include a selective etch for each of the top spacer layer material, dummy gate layer material, and bottom spacer layer material. In various embodiments, a column including the bottom source/drain region 135, vertical fin 180, dummy gate 155, top source/drain 200, and protective cap 210 can be formed by the directional etching.

Figure 7:
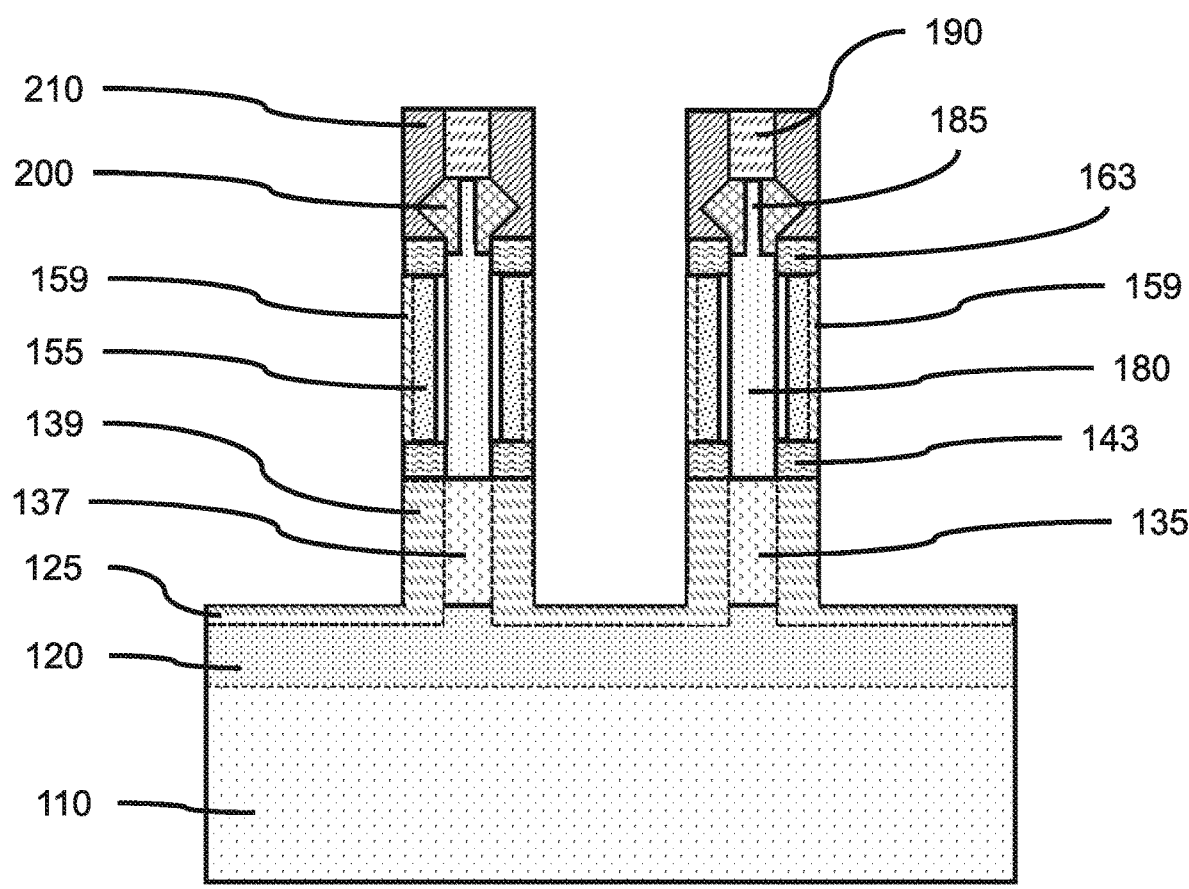
FIG. 7 is a cross-sectional side view showing a reactant layer formed on the exposed surfaces of the counter-doped layer, bottom source/drain regions, and dummy gates, in accordance with an embodiment of the present invention.

FIG. 7 is a cross-sectional side view showing a sacrificial layer formed on the exposed surfaces of the counter-doped layer, bottom source/drain regions, and dummy gates, in accordance with an embodiment of the present invention.

In one or more embodiments, the exposed surfaces of the counter-doped layer 120, bottom source/drain regions 135, and dummy gates 155 can be reacted with one or more reactants (e.g., $H_2O$, $O_2$, $O_3$, etc., and suitable combinations thereof)) that can oxidize the exposed materials to form a sacrificial material, where the sacrificial material can be an oxide of the counter-doped layer material, bottom source/drain region material, and dummy gate material. The oxidized material can form a sacrificial layer on each of the counter-doped layer 120, bottom source/drain regions 135, and dummy gates 155 that can be subsequently removed.

In one or more embodiments, the counter-doped layer 120 can be reacted with the suitable reactant to form an expendable reactant layer 125, where the expendable reactant layer 125 can be selectively etched in relation to the counter-doped layer 120. The bottom source/drain regions 135 can be reacted with the suitable reactant to form a disposable layer 139 on opposite sides of each bottom source/drain region 135 and a condensation source/drain pillar 137 between the two adjacent disposable layers 139. In a non-limiting exemplary embodiment, the bottom source/drain regions 135 can be silicon-germanium and the condensation source/drain pillar 137 can be germanium rich silicon-germanium. The one or more condensation source/drain pillars can be doped with a p-type dopant, for example, boron. A converted dummy layer 159 can be formed by the reaction of the dummy gate 155 with the reactant(s).

In a non-limiting exemplary embodiment, the counter-doped layer 120, bottom source/drain regions 135, and dummy gates 155 can be exposed to an oxidizing environment that forms oxide layers at the exposed surfaces, including a silicon oxide at the surfaces of a silicon-germanium bottom source/drain 135. The reaction of the silicon-germanium can create a germanium-rich condensation source/drain pillar 137 between opposing faces of the bottom source/drain region(s).

While not intending to be bound by theory, it is believed that the increase in germanium concentration in the section of the bottom source/drain region(s) below the vertical fin(s) increases the lattice constant of the unreacted condensation source/drain pillar(s) 137. The change in lattice constant produces a compressive stress, and a compressive strain in the overlying vertical fin 180. In various embodiments, the germanium concentration of the condensation source/drain pillar 137 can be maintained below a threshold value at which the height of the condensation source/drain pillar 137 and change in lattice constant caused by the increase in germanium concentration would generate dislocations.

In one or more embodiments, the one or more vertical fin(s) 180 is under a compressive strain imposed by the underlying condensation source/drain pillar 137 due to the change in the lattice constant. In various embodiments, the amount of induced strain can be controlled by adjusting the change in germanium concentration in the underlying condensation source/drain pillar 137. In various embodiments, the change in germanium concentration can induce a compressive stress in the range of about 200 MPa to about 2 GPa in the overlying vertical fin 180.

In various embodiments, the protective cap 210 and fin cap 190 can be a material that does not react with the reactants to produce an oxide or become further oxidized. The top spacer(s) 163 and bottom spacer(s) 143 can also be made of a material that does not undergo oxidation or further oxidation.

Figure 8:
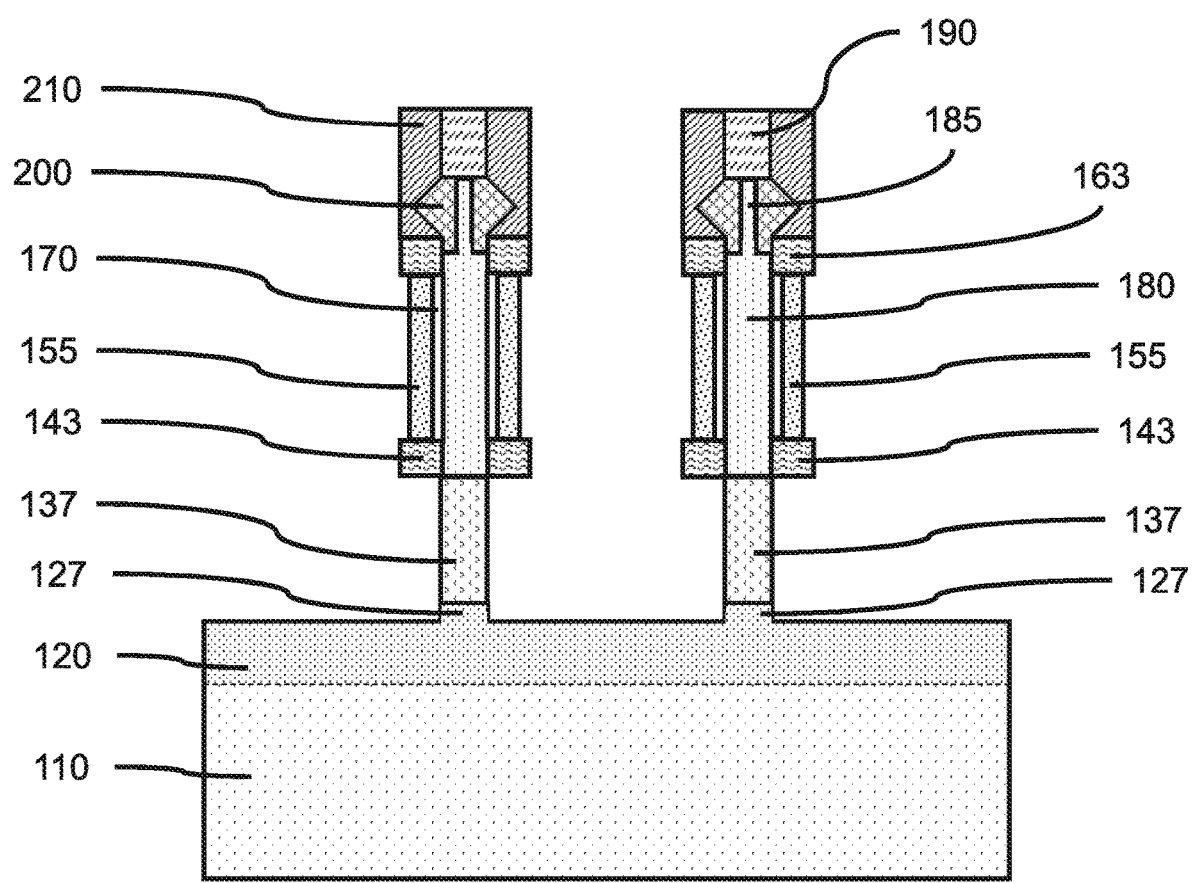
FIG. 8 is a cross-sectional side view showing the counter-doped layer, condensation source/drain pillars, and dummy gates after removal of the sacrificial material from the reacted surfaces, in accordance with an embodiment of the present invention.

FIG. 8 is a cross-sectional side view showing the counter-doped layer, condensation source/drain pillars, and dummy gates after removal of the sacrificial material from the reacted surfaces, in accordance with an embodiment of the present invention.

In one or more embodiments, the expendable reactant layer 125 can be removed from the counter-doped layer 120.

The expendable reactant layer 125 can be removed using a selective etch, for example, an isotropic wet etch or dry plasma etch. Removal of the expendable reactant layer 125 can leave a mesa 127 with a step in the counter-doped layer 120 below the condensation source/drain pillar(s) 137 formed from the bottom source/drain region(s) 135.

In one or more embodiments, the disposable layer 139 can be removed from the condensation source/drain pillar 137. The disposable layer 139 can be removed using a selective etch, for example, an isotropic wet etch or dry plasma etch, for the material formed from the bottom source/drain region(s) 135. Removal of the disposable layer 139 can leave the condensation source/drain pillar 137 supporting the vertical fin 180, bottom spacers 143, top spacers 163, dummy gate 155, and top source/drain 200 on the counter-doped layer. The condensation source/drain pillar 137 can be between the mesa 127 of the counter-doped layer 120 and the vertical fin 180. The endwalls of the condensation source/drain pillar(s) 137 and vertical fin(s) 180 can remain anchored to source/drain region material and dummy gate material respectively, so at least the vertical fin(s) are fixed laterally and vertically in position. By fixing the vertical fin(s) 180 in position vertically, the condensation source/drain pillar 137 can exert an upward pressure on the base of the vertical fin to impart a compressive stress, where the vertical fin 180 cannot move to relieve the stress.

In one or more embodiments, the converted dummy layer 159 can be removed from the dummy gate 155. The converted dummy layer 159 can be removed using a selective etch, for example, an isotropic wet etch or dry plasma etch, for the material formed from the dummy gate 155. Removal of the converted dummy layer 159 can leave a recess in the dummy gate between the upper spacers 163 and the bottom spacers 143.

In a non-limiting exemplary embodiment, the material of the bottom source/drain regions 135, dummy gates 155 and counter-doped layer 120 can include silicon, which can react to form a silicon oxide (e.g., silicon dioxide ($SiO_2$)), which can be removed using a hydrofluoric (HF) acid wet etch.

Figure 9:
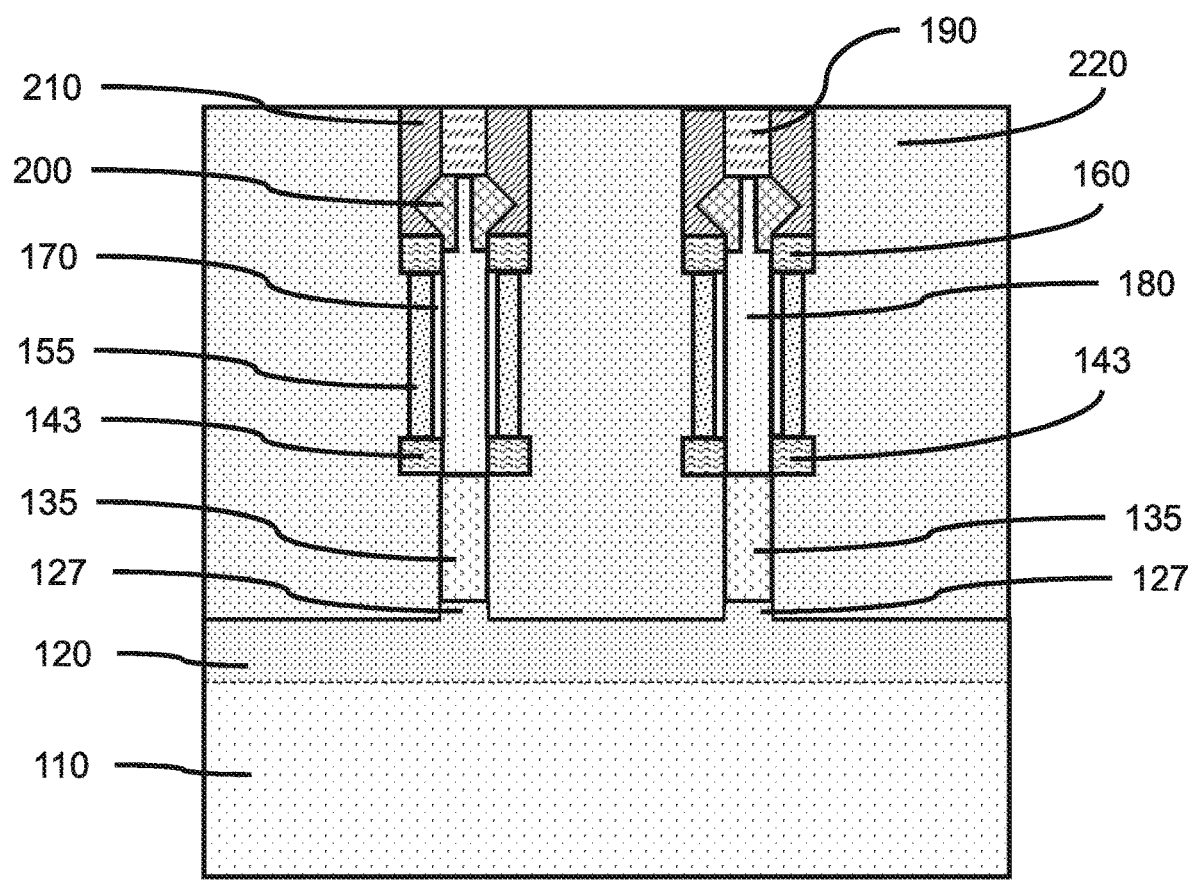
FIG. 9 is a cross-sectional side view showing an interlayer dielectric on the counter-doped layer, condensation source/drain pillars, and dummy gates, in accordance with an embodiment of the present invention.

FIG. 9 is a cross-sectional side view showing an interlayer dielectric on the counter-doped layer, condensation source/drain pillars, and dummy gates, in accordance with an embodiment of the present invention.

In one or more embodiments, an interlayer dielectric (ILD) 220 can be formed on the counter-doped layer 120, condensation source/drain pillars 137, and dummy gates 155, where the interlayer dielectric 220 can be formed by a blanket deposition (e.g., CVD). The ILD may extend above the top surfaces of the protective cap 210 and fin cap 190. A chemical-mechanical polishing may be utilized to remove a portion of the ILD to reduces the height to the top surfaces of the protective cap 210 and fin cap 190, and provide a smooth, flat surface for subsequent processing.

In one or more embodiments, the interlayer dielectric 220 can be silicon oxide, (SiO), a low-k dielectric, or a combination thereof, where the ILD can be formed by CVD, LPCVD, or spun on. In various embodiments, a low-k dielectric material can be a fluoride-doped silicon oxide (e.g., fluoride doped glass), a carbon-doped silicon oxide, a porous silicon oxide, a spin-on silicon based polymeric material (e.g., tetraethyl orthosilicatehydrogen (TEOS), silsesquioxane (HSQ) and methylsilsesquioxane (MSQ)), or combinations thereof.

Figure 10:
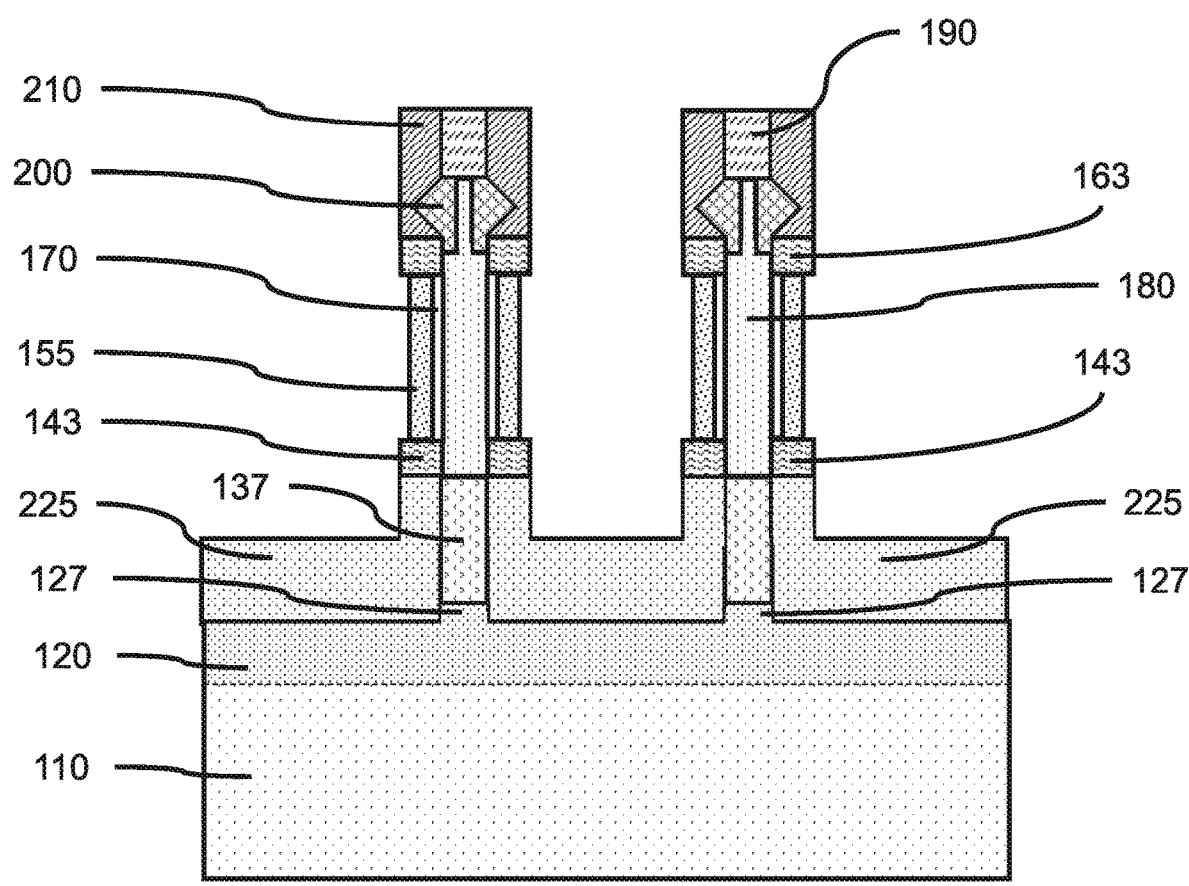
FIG. 10 is a cross-sectional side view showing an interlayer dielectric with a reduced height on the counter-doped layer, in accordance with an embodiment of the present invention.

FIG. 10 is a cross-sectional side view showing an interlayer dielectric with a reduced height on the counter-doped layer, in accordance with an embodiment of the present invention.

In one or more embodiments, the height of the interlayer dielectric 220 can be reduced to expose the dummy gate(s) 155, and top and bottom spacers 163, 143, while leaving the condensation source/drain pillars 137 covered by at least a portion of the interlayer dielectric spacer 225. The height of the interlayer dielectric 220 can be reduced using a directional etch (e.g. RIE) to remove an upper portion of the interlayer dielectric 220, while the portion of the ILD below the bottom spacers 143 remain on the sides of the condensation layers 137, where the etch can be a timed etch. The height of the ILD may be reduced below the level of the bottom surface of the bottom spacers 143. The interlayer dielectric spacer 225 can provide electrical insulation of the condensation source/drain pillars 137.

Figure 11:
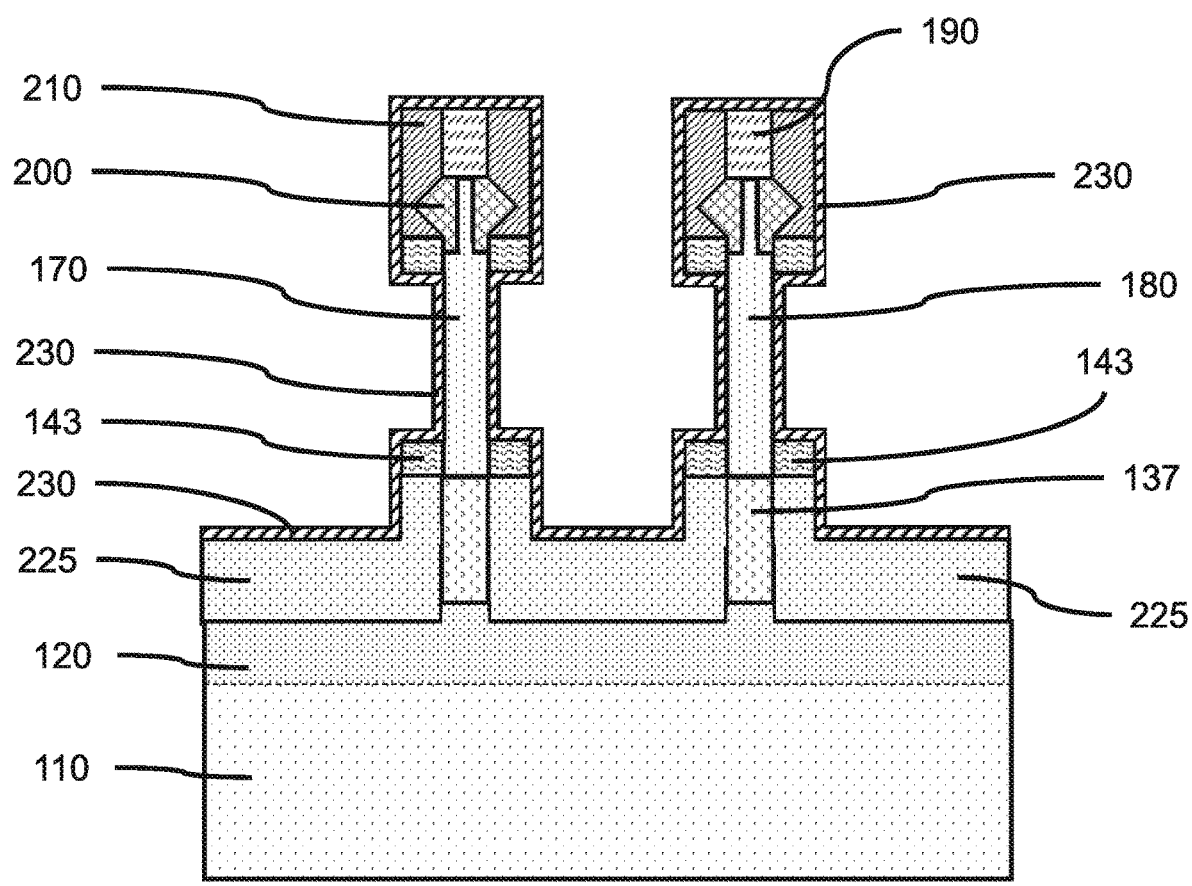
FIG. 11 is a cross-sectional side view showing a gate dielectric layer on the exposed surfaces of the interlayer dielectric spacer, protective cap, and vertical fin after removal of the dummy gate and dummy gate dielectric, in accordance with an embodiment of the present invention.

FIG. 11 is a cross-sectional side view showing a gate dielectric layer on the exposed surfaces of the interlayer dielectric spacer, protective cap, and vertical fin after removal of the dummy gate and dummy gate dielectric, in accordance with an embodiment of the present invention.

In one or more embodiments, the dummy gate(s) 155 and dummy gate dielectric 170 can be removed using an isotropic etch, where the etch can be a wet etch or dry plasma etch selective for the dummy gate(s) 155 and dummy gate dielectric 170. The dummy gate(s) 155 and dummy gate dielectric 170 can be removed using two separate selective etches. The sidewalls of the vertical fin(s) 180 can be exposed after removal of the dummy gate and dummy gate dielectric.

In one or more embodiments, a gate dielectric layer 230 can be formed on the exposed surfaces of the protective cap 210, fin cap 190, vertical fin(s) 180, bottom spacers 143, top spacers 163, and interlayer dielectric spacer 225. The gate dielectric layer 230 can be formed by a conformal deposition (e.g. ALD, PEALD), where the deposition forms a gate dielectric layer 230 of a predetermined thickness.

In one or more embodiments, the gate dielectric layer 230 can have a thickness in the range of about 2 Å to about 10 nm, or about 4 Å to about 5 nm, or about 1 nm to about 3 nm.

In one or more embodiments, the gate dielectric layer 230 can be an insulating dielectric layer, for example, a silicon oxide (SiO), silicon nitride (SiN), silicon oxynitride (SiON), a high-K dielectric, or a suitable combination of these materials.

In various embodiments, the gate dielectric layer 230 can be a high-K dielectric material that can include, but is not limited to, transition metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide (Pb($Sc_xTa_{1-x}$)$O_3$), and lead zinc niobate (e.g., $PbZn_{1/3}Nb_{2/3}O_3$). The high-K material can further include dopants such as lanthanum and/or aluminum. The stoichiometry of the high-K compounds can vary.

Figure 12:
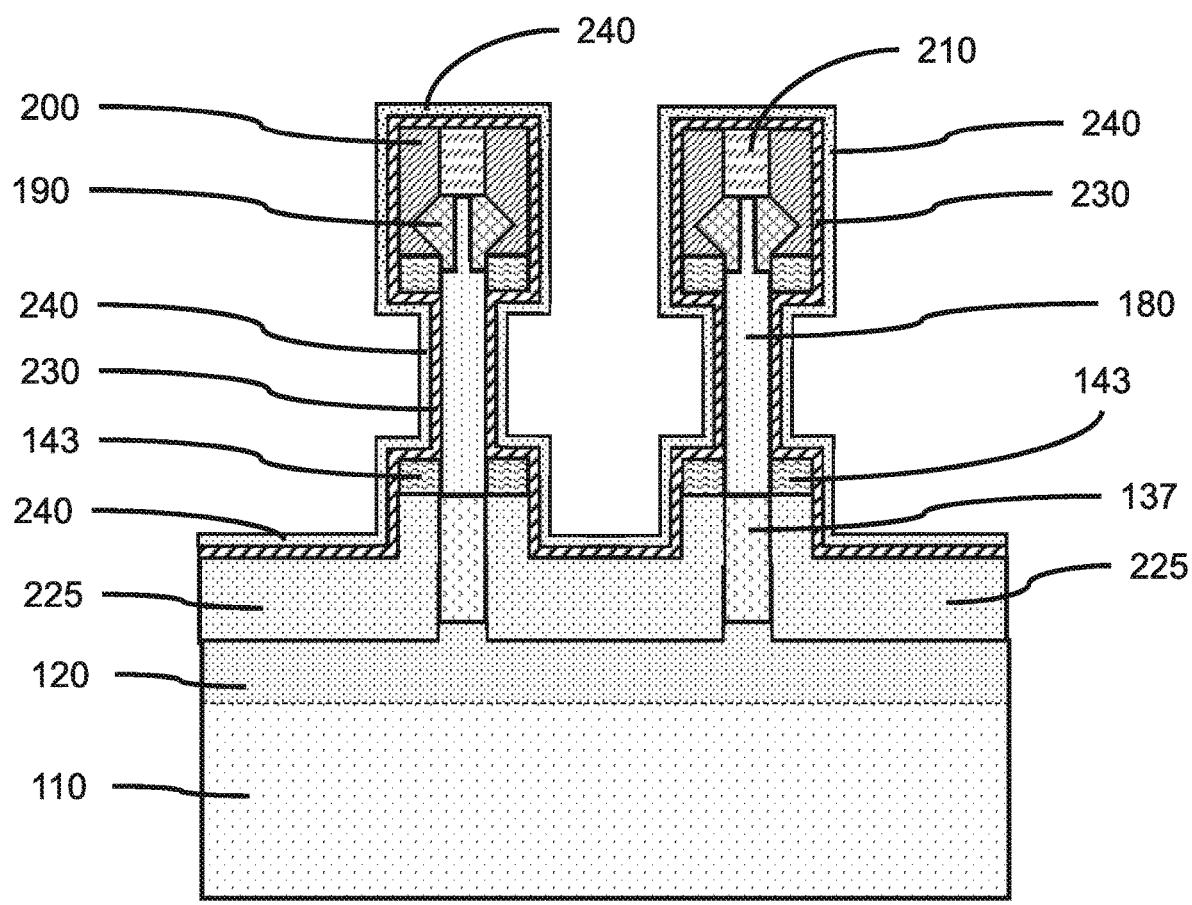
FIG. 12 is a cross-sectional side view showing a work function layer on the gate dielectric layer, in accordance with an embodiment of the present invention.

FIG. 12 is a cross-sectional side view showing a work function layer on the gate dielectric layer, in accordance with an embodiment of the present invention.

In one or more embodiments, a work function layer 240 can be formed on the gate dielectric layer 230, where the work function layer and gate dielectric layer 230 can cover at least a portion of the sidewalls of the vertical fin(s) 180. A work function layer 240 can be formed on the exposed portion(s) of the gate dielectric layer 230. The work function layer 240 can be formed on the gate dielectric layer 230 to adjust the electrical properties of a gate electrode. In various embodiments, the work function layer 240 can be optional.

In one or more embodiments, the work function layer 240 can be formed by a conformal deposition, for example, ALD.

In various embodiments, a work function layer can be a conductive nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a conductive carbide, including but not limited to titanium carbide (TiC), titanium aluminum carbide (TiAlC), tantalum carbide (TaC), hafnium carbide (HfC); or combinations thereof. The work function layer 240 can include multiple layers of work function materials, for example, a work function layer can be a TiN/TiC stack.

In various embodiments, the work function layer 240 can have a thickness in the range of about 3 nm to about 11 nm, or can have a thickness in the range of about 5 nm to about 8 nm.

Figure 13:
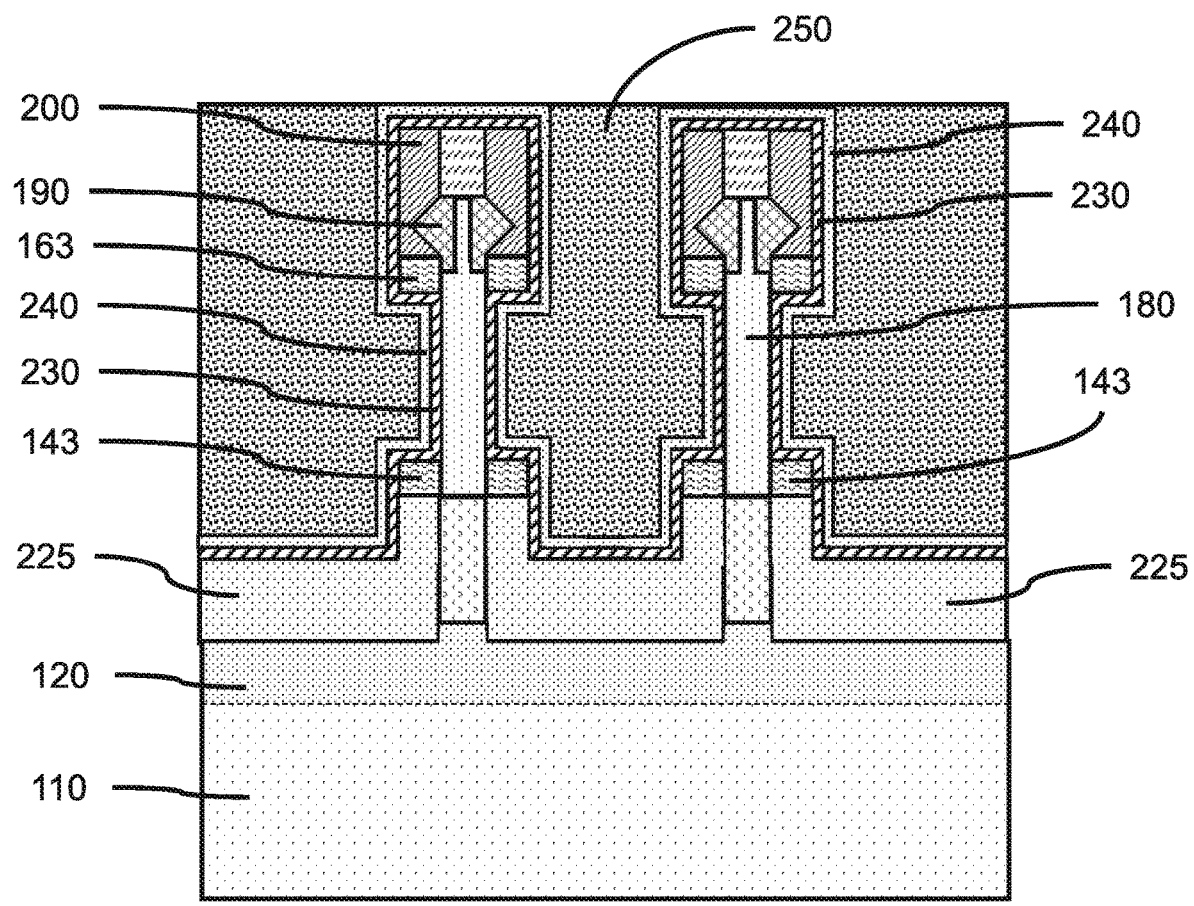
FIG. 13 is a cross-sectional side view of a gate fill layer on the work function layer, in accordance with an embodiment of the present invention.

FIG. 13 is a cross-sectional side view of a gate fill layer on the work function layer, in accordance with an embodiment of the present invention.

In one or more embodiments, a gate fill layer 250 can be formed on the gate dielectric layer 230 and/or work function layer 240 if present, where the gate fill layer 250 can fill in the space between vertical fins 180. The gate fill layer 250, gate dielectric layer 230, and optionally the work function layer 240, can form a gate structure on one or more vertical fin(s) 180, where the gate fill layer 250 and work function layer 240 can form a conductive gate electrode. The gate structure can be formed by a replacement metal gate process and gate patterning.

In various embodiments, the gate fill layer 250 can be blanket deposited on the exposed surfaces of the gate dielectric layer 230 and/or work function layer 240 on the vertical fin(s) 180. The formed gate fill layer 250 can extend above the top surface of the protective cap 210 and fin cap 190, where the gate fill layer material above the top surfaces can be removed by a CMP to provide a flat, uniform surface.

In various embodiments, the gate fill layer 250 can be a conductive metal, where the metal can be tungsten (W), titanium (Ti), molybdenum (Mo), cobalt (Co), or a conductive carbon material (e.g., carbon nanotube, graphene, etc.), or any suitable combinations thereof.

Figure 14:
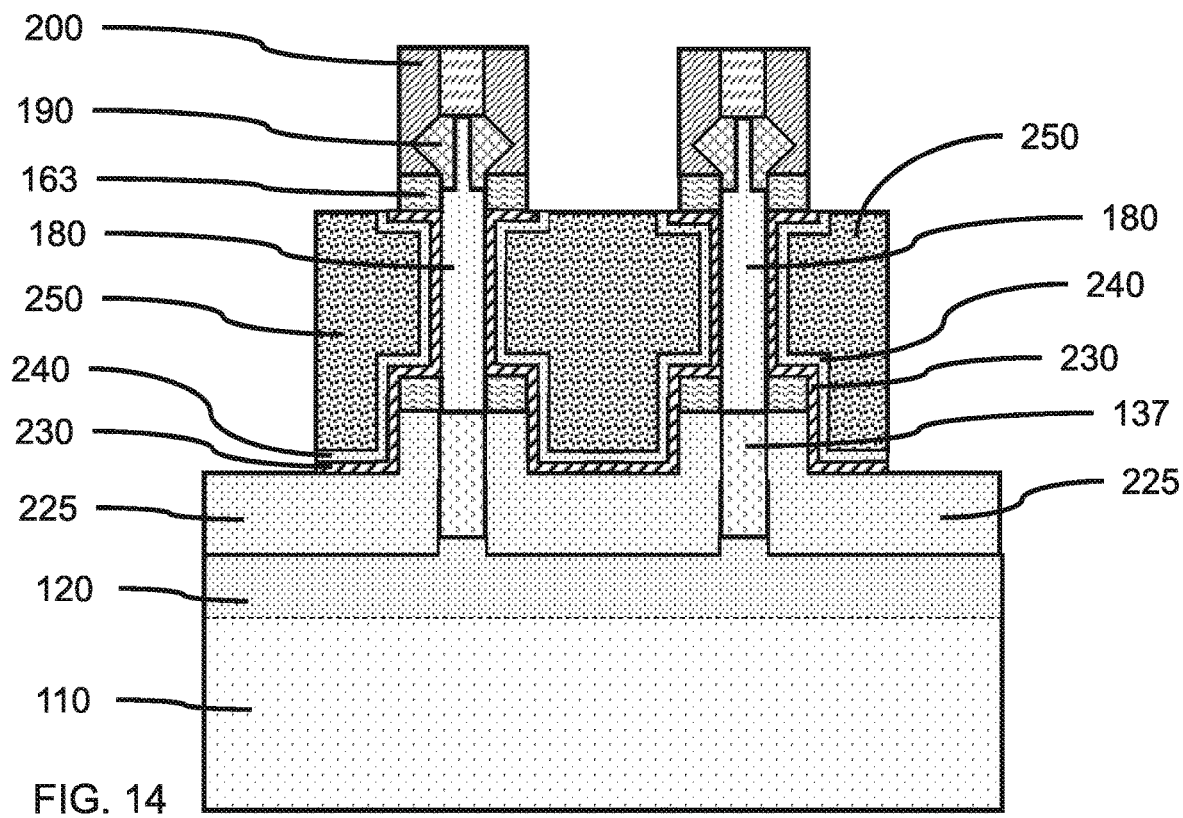
FIG. 14 is a cross-sectional side view of a gate structure on each of the vertical fins, in accordance with an embodiment of the present invention.

FIG. 14 is a cross-sectional side view of a gate structure on each of the vertical fins, in accordance with an embodiment of the present invention.

In one or more embodiments, a portion of the gate fill layer 250 can be removed, where the gate fill layer 250 can be removed by a directional etch. Portions of the gate fill layer 250 may be masked, so only predetermined portions of the gate fill layer are exposed to the directional etch (e.g., RIE) and removed, as would be known in the art. In various embodiments, portions of the gate fill layer 250 may be completely removed to expose the underlying work function layer 240 and/or gate dielectric layer 230 on the interlayer dielectric spacer 225.

In various embodiments, the gate structure extends below the level of the bottom surface of the bottom spacers 143, where a portion of the gate fill layer and work function layer can be below the bottom surface of the vertical fin 180 and at a height level with at least a portion of the condensation source/drain pillar(s) 137. The top of the gate structure including the gate fill layer 250 can be even with the bottom surface of the top spacers 163.

Figure 15:
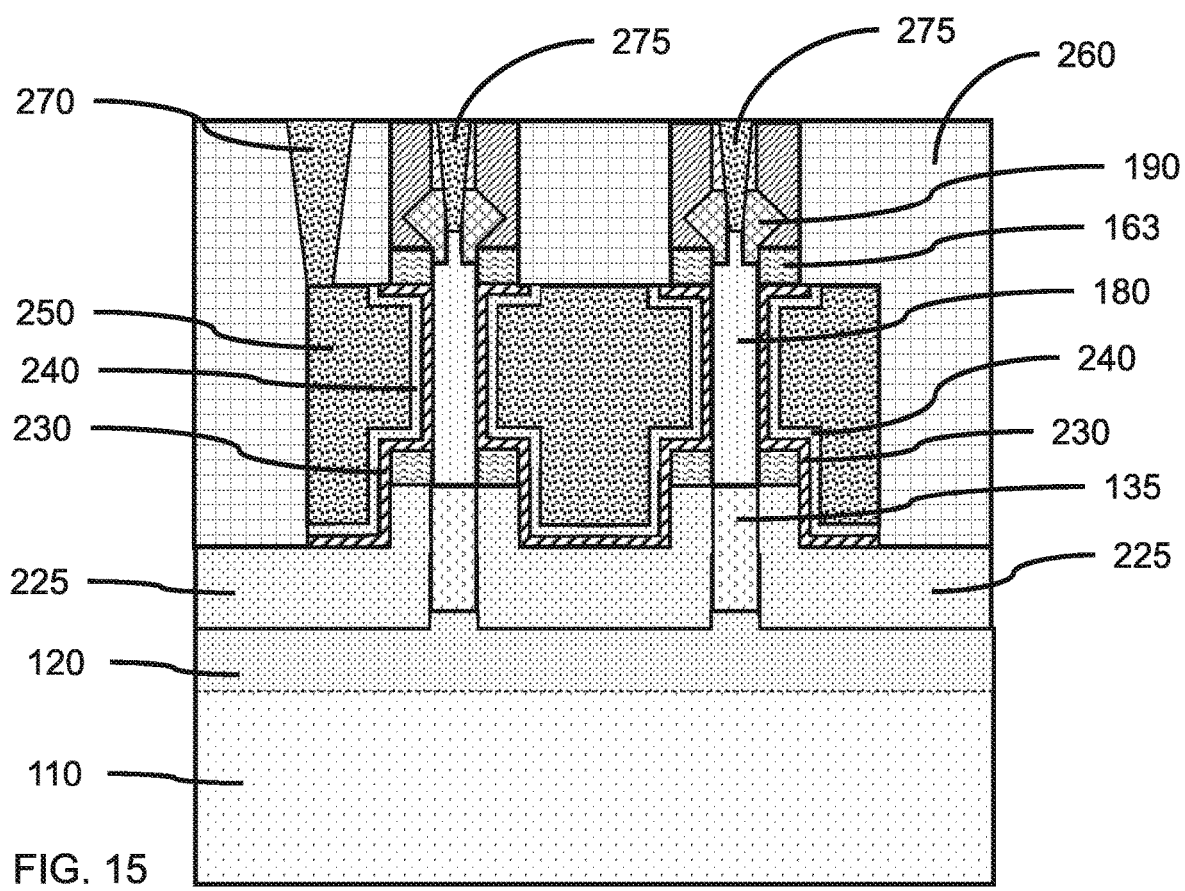
FIG. 15 is a cross-sectional side view showing a second interlayer dielectric on the gate structure, in accordance with an embodiment of the present invention.

FIG. 15 is a cross-sectional side view showing a second interlayer dielectric on the gate structure, in accordance with an embodiment of the present invention.

In various embodiments, electrical contacts can be formed to the gate structure, where the contact can be to the conductive gate electrode, and source/drain components 137, 200. In one or more embodiments, interconnect vias may be formed in the second interlayer dielectric layer 260 and filled with a conductive material (e.g., tungsten. copper, titanium, molybdenum, aluminum, or combinations thereof) to form electrical contacts 270, 275, where the electrical contacts may be gate electrode contacts 270, top source/drain contacts 275, or condensation source/drain pillar 137 contacts.

In various embodiments, the electrical contacts may be gate structure contacts, top source/drain contacts, or condensation source/drain pillar contacts, where the electrical contact are placed in locations where there will be minimum interference between contacts and intervening layers.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should be understood that use of descriptions such as top, bottom, left, right, vertical, horizontal, or the like, are intended to be in reference to the orientation(s) illustrated in the figures, and are intended to be descriptive and to distinguish aspects of depicted features without being limiting. Spatially relative terms, such as "beneath," "below," "lower," "above," "upper," and the like, may be used herein for ease of description to describe one element's or feature's relationship to another element(s) or feature(s) as illustrated in the FIGs. It will be understood that the spatially relative terms are intended to encompass different orientations of the device in use or operation in addition to the orientation depicted in the FIGs. For example, if the device in the FIGs. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Reference to first, second, third, etc., feature is intended to distinguish features without necessarily implying a particular order unless otherwise so stated or indicated.

Thus, a first element discussed herein could be termed a second element without departing from the scope of the present concept.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a device and fabrication method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A strained vertical p-type field effect transistor, comprising:
 a bottom source/drain region on a substrate;
 an interlayer dielectric spacer on the substrate and on opposite sides of the bottom source/drain region;
 a vertical fin on the bottom source/drain region;
 a bottom spacer on the interlayer dielectric spacer and on opposite sides of the vertical fin; and
 a gate dielectric layer on the vertical fin, bottom spacer, and interlayer dielectric spacer.

2. The strained vertical p-type field effect transistor of claim 1, further comprising a counter-doped layer between the interlayer dielectric spacer and the substrate.

3. The strained vertical p-type field effect transistor of claim 1, further comprising a fin post on the vertical fin opposite the bottom source/drain region.

4. The strained vertical p-type field effect transistor of claim 3, further comprising a top source/drain in direct contact with the fin post.

5. The strained vertical p-type field effect transistor of claim 1, further comprising top spacers on the gate dielectric layer and on opposite sides of the vertical fin.

6. The strained vertical p-type field effect transistor of claim 5, further comprising a work function layer on the gate dielectric layer, wherein the work function layer extends below the bottom spacer.

7. The strained vertical p-type field effect transistor of claim 6, further comprising a gate fill layer on the work function layer, wherein the gate fill layer extends below the bottom spacer.

8. The strained vertical p-type field effect transistor of claim 1, wherein the vertical fin is under a compressive strain imposed by an underlying condensation source/drain pillar between opposing faces of the bottom source/drain region.

9. The strained vertical p-type field effect transistor of claim 8, wherein the one or more vertical fins are single crystal silicon.

10. A strained vertical p-type field effect transistor, comprising:
 a bottom source/drain region on a substrate;
 a condensation source/drain pillar between opposing faces of the bottom source/drain region;
 an interlayer dielectric spacer on the substrate and on opposite sides of the bottom source/drain region;
 a vertical fin on the bottom source/drain region;
 a bottom spacer on the interlayer dielectric spacer and on opposite sides of the vertical fin;

a gate dielectric layer on the vertical fin, bottom spacer, and interlayer dielectric spacer; and a gate fill layer on the gate dielectric layer, wherein the gate fill layer extends below the bottom spacer.

11. The strained vertical p-type field effect transistor of claim 10, further comprising top spacers on the gate dielectric layer and on opposite sides of the vertical fin.

12. The strained vertical p-type field effect transistor of claim 11, wherein the vertical fin is under a compressive stress imposed by the underlying condensation source/drain pillar in the range of about 200 MPa to about 2 GPa.

13. The strained vertical p-type field effect transistor of claim 12, wherein the one or more vertical fins are single crystal silicon.

14. The strained vertical p-type field effect transistor of claim 13, further comprising a mesa having a step in the counter-doped layer below the condensation source/drain pillar.

15. A method of forming a strained vertical p-type field effect transistor, comprising:

forming a condensation source/drain pillar on a substrate and a vertical fin on the condensation source/drain pillar;

forming a bottom spacer on opposite sides of the vertical fin;

forming a dummy gate dielectric on a portion of the vertical fin adjacent to the bottom spacer;

forming a dummy gate on the dummy gate dielectric; and exposing the dummy gate to an oxidizing atmosphere to form a converted dummy gate.

16. The method of claim 15, further comprising removing the converted dummy gate to form a recess.

17. The method of claim 15, further comprising forming a counter-doped layer between the substrate and the condensation source/drain pillar.

18. The method of claim 17, further comprising, wherein the condensation source/drain pillar is silicon-germanium (SiGe) having a germanium concentration below a threshold value at which the germanium concentration would generate dislocations.

19. The method of claim 18, wherein the condensation source/drain pillar is doped with boron.

20. The method of claim 19, wherein the counter-doped layer has a dopant concentration in the range of about $1 \times 10^{17}$ cm$^{-3}$ to about $2 \times 10^{21}$ cm$^{-3}$.

* * * * *